United States Patent
Gilchrist

(10) Patent No.: US 6,737,826 B2
(45) Date of Patent: May 18, 2004

(54) SUBSTRATE TRANSPORT APPARATUS WITH MULTIPLE INDEPENDENT END EFFECTORS

(75) Inventor: Ulysses Gilchrist, Reading, MA (US)

(73) Assignee: Brooks Automation, Inc., Chelmsford, MA (US)

( * ) Notice: Subject to any disclaimer, the term of this patent is extended or adjusted under 35 U.S.C. 154(b) by 0 days.

(21) Appl. No.: 10/196,066

(22) Filed: Jul. 15, 2002

(65) Prior Publication Data

US 2003/0011338 A1 Jan. 16, 2003

Related U.S. Application Data

(60) Provisional application No. 60/305,052, filed on Jul. 13, 2001.

(51) Int. Cl.⁷ .............................................. G05B 19/04
(52) U.S. Cl. ........................ 318/568.21; 318/568.12; 318/567; 414/751.1; 414/753.1; 414/744.8; 74/490.01; 74/490.03; 74/490.05; 74/490.06
(58) Field of Search ................................ 318/560, 567, 318/568.12, 568.21; 414/751.1, 753.1, 744.8; 74/490.01, 490.03, 490.05, 490.06

(56) References Cited

U.S. PATENT DOCUMENTS

| | | | |
|---|---|---|---|
| 4,913,617 A | * | 4/1990 | Nicholson .................. 414/729 |
| 5,151,008 A | * | 9/1992 | Ishida et al. ............. 414/744.5 |
| 5,180,276 A | * | 1/1993 | Hendrickson ............ 414/752.1 |
| 5,577,879 A | * | 11/1996 | Eastman et al. ......... 414/744.5 |
| 5,765,444 A | * | 6/1998 | Bacchi et al. ............ 74/490.03 |
| 5,765,983 A | * | 6/1998 | Caveney et al. ............ 414/217 |
| 5,885,052 A | * | 3/1999 | Tsuji et al. ............... 414/744.6 |
| 5,944,476 A | * | 8/1999 | Bacchi et al. ............... 414/783 |
| 6,105,454 A | * | 8/2000 | Bacchi et al. ............ 74/490.03 |

* cited by examiner

*Primary Examiner*—Rina I Duda
(74) *Attorney, Agent, or Firm*—Perman & Green, LLP; Richard Pickreign

(57) ABSTRACT

A substrate processing apparatus comprising a frame, a drive section, an articulated arm, and at least one pair of end effectors. The drive section is connected to the frame. The articulated arm is connected to the drive section. The articulated arm has a shoulder and a wrist. The arm is pivotally mounted to the drive section at the shoulder. The drive section is adapted to rotate the articulated arm relative to the frame about an axis of rotation at the shoulder, and to displace the wrist relative the shoulder. The pair of end effectors is connected to the articulated arm. The pair of end effectors is pivotally jointed to the wrist of the articulated arm to rotate relative to the articulated arm about a common axis of rotation at the wrist. Each end effector is independently pivotable relative to each other about the common axis of rotation at the wrist. At least one end effector is independently pivotable about the common axis of rotation of the wrist relative to the articulated arm.

30 Claims, 7 Drawing Sheets

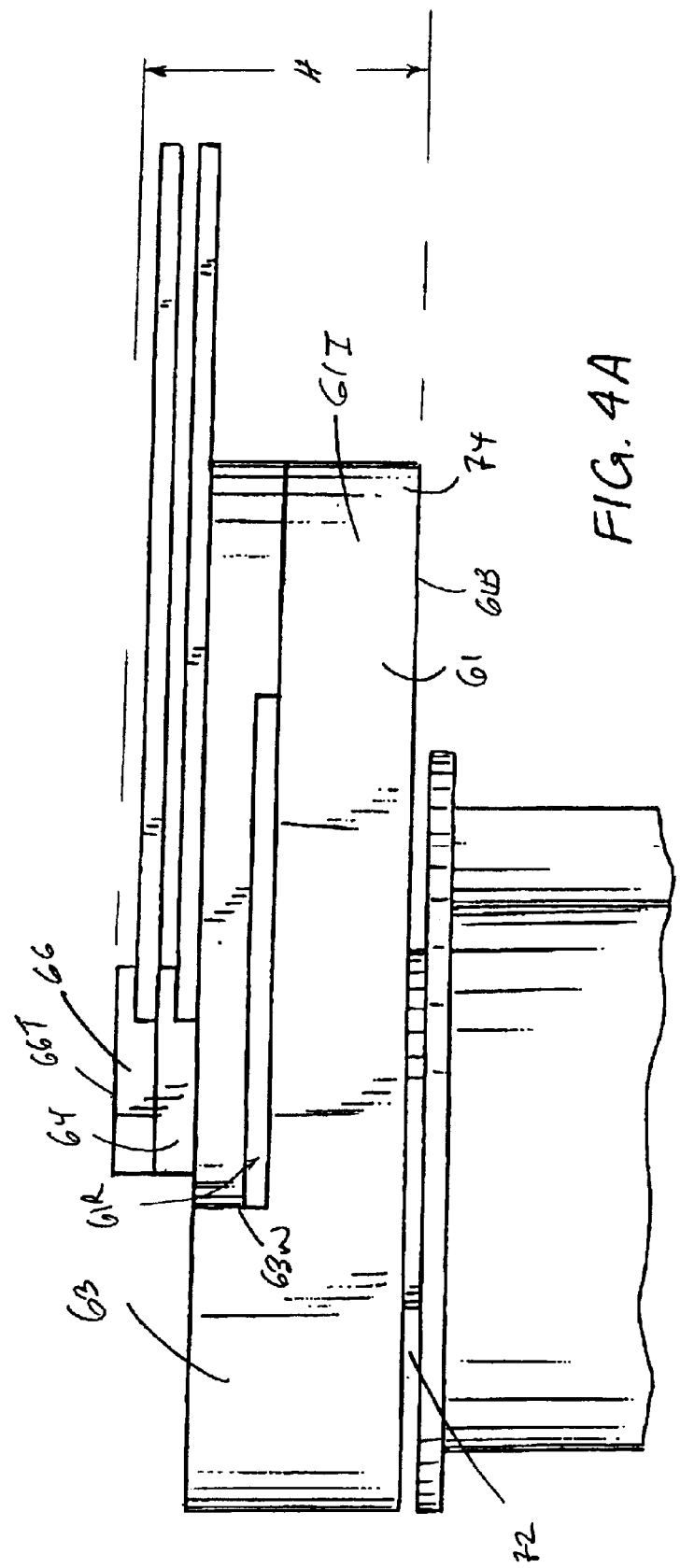

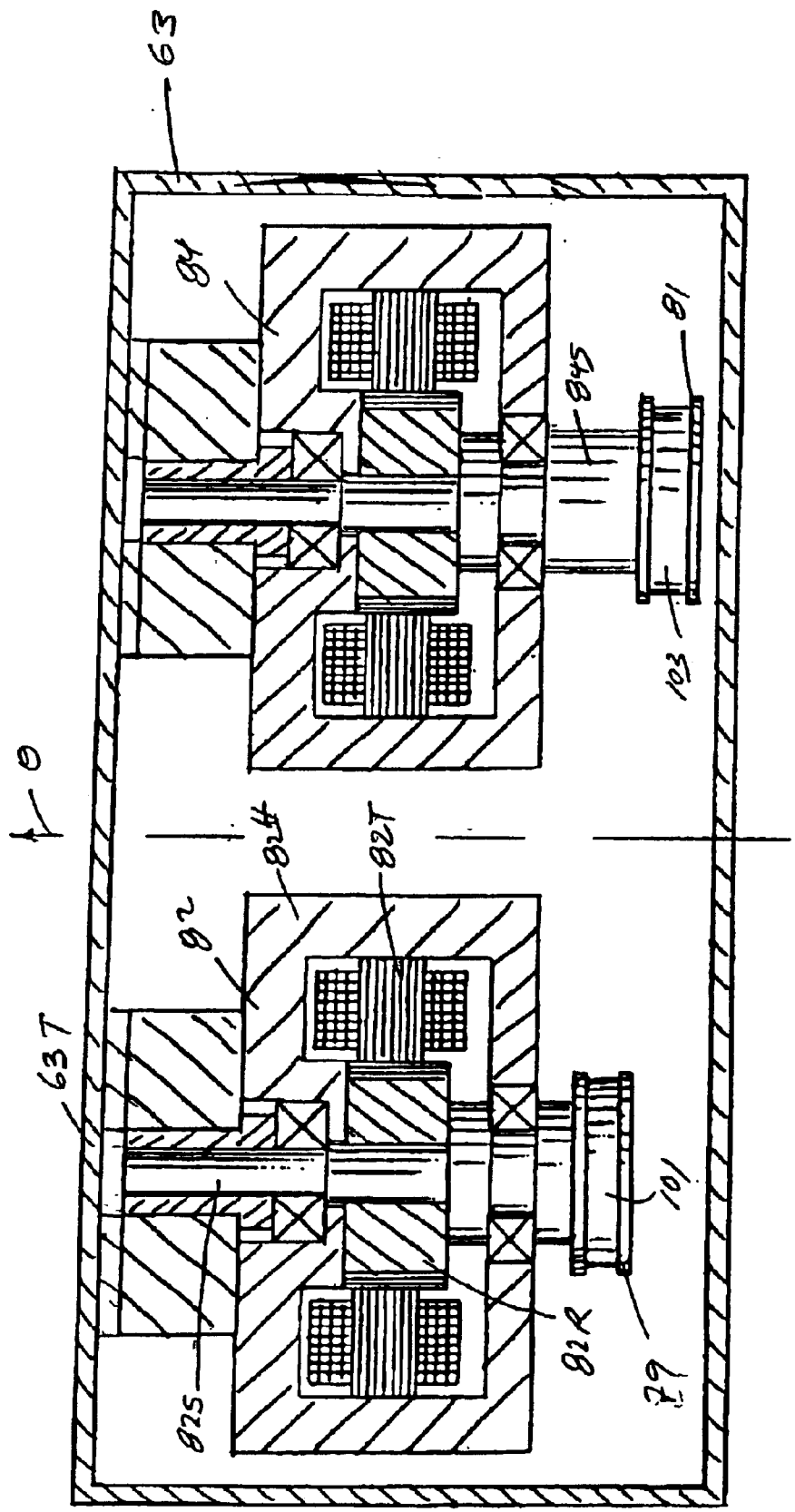

SUBSTRATE TRANSPORT APPARATUS WITH MULTIPLE INDEPENDENT END EFFECTORS

CROSS-REFERENCE TO RELATED APPLICATION(S)

This application claims the benefit of U.S. Provisional Application No. 60/305,052, filed Jul. 13, 2001, which is incorporated by reference herein in its entirety.

BACKGROUND OF THE INVENTION

1. Field of the Invention

The present invention relates to a substrate processing apparatus and, more particularly, to a substrate processing apparatus with a transport apparatus having multiple independent end effectors.

2. Prior Art

The throughput of a substrate processing apparatus is a significant concern of manufacturers of semi-conducting substrates (e.g. manufacturers of semi-conducting wafers or of flat panel displays). The throughput of a given substrate processing apparatus has a direct impact on the cost of the processed substrate and hence on the final cost of any electronic devices which employ the substrates either in part on in their entirety. The higher the throughput, the lower the fabrication costs of the substrates and hence the lower the costs of the final product. The throughput of a substrate processing apparatus is dependent at least in part on the efficiency and speed with which substrates are transported from the storage cassettes, such as the commonly used front opening universal pods (FOUP), through the processing apparatus and returned to the FOUPs. There are conventional substrate processing apparatus, which employ substrate transport apparatus with one or more end effectors for carrying one of more substrates which may allow for faster swapping of substrates for example. Some of the end effectors on these conventional substrate transport apparatus may be independently operable. The drives driving these end effectors are located on the end of the transport arm, proximate the end effector. This increases the mass moment of the arm, with a corresponding impact on the speed and control of the transport arm during movement of the substrates. Substrate transport apparatus having the end effector drive at the end of the transport arm also has a large space envelope. It is desired to maintain the space envelope of the substrate transport arm as small as possible in order to minimize the size of the processing apparatus thereby allowing a larger number of processing apparatus to be employed within a given manufacturing facility. The present invention overcomes the problems of conventional substrate process apparatus as will be described in greater detail below.

SUMMARY OF THE INVENTION

In accordance with a first embodiment of the present invention, a substrate processing apparatus is provided. The apparatus comprises a frame, a drive section, an articulated arm, and at least one pair of end effectors. The drive section is connected to the frame. The articulated arm is connected to the drive section. The articulated arm has a shoulder and a wrist. The articulated arm is pivotally mounted to the drive section at the shoulder. The drive section is adapted to rotate the articulated arm relative to the frame about an axis of rotation at the shoulder, and to displace the wrist relative to the shoulder. The pair of end effectors is connected to the articulated arm. The pair of end effectors is pivotally jointed to the wrist of the articulated arm to rotate relative to the articulated arm about a common axis of rotation at the wrist. Each end effector is independently pivotable relative to each other about the common axis of rotation at the wrist and at least one of the end effectors is independently pivotable about the common axis of rotation of the wrist relative to the articulated arm.

In accordance with another embodiment of the present invention, a substrate transport apparatus is provided. The apparatus comprises a drive section, an upper arm, a forearm, and at least one pair of end effectors. The upper arm is connected to the drive section. The forearm is movably connected to the upper arm. The pair of end effectors is movably connected to the forearm so that the pair of end effectors is movable relative to the forearm. The pair of end effectors are located on the forearm. The pair of end effectors are operably connected to the drive section for moving the pair of end effectors relative to the forearm. Each end effector of the pair of end effectors is independently movable relative to each other.

In accordance with another embodiment of the present invention, a substrate transport apparatus is provided. The apparatus comprises a drive section, an articulated arm, at least one pair of end effectors, and another drive section. The drive section has a coaxial shaft assembly. The articulated arm is operably connected to the coaxial shaft assembly at a shoulder of the arm for rotating the arm about the shoulder and extending or retracting the arm relative to the shoulder. The pair of end effectors is movably connected to the articulated arm so that each end effector of the pair is independently pivotable relative to the articulated arm about a common axis of rotation. The other drive section is operably connected to the pair of end effectors for moving the end effectors relative to the arm. The other drive section has at least one motor mounted on the arm proximate the shoulder.

In accordance with another embodiment of the present invention, a substrate transport apparatus is provided. The apparatus comprises a drive section, an upper arm, a forearm, and at least one pair of end effectors. The upper arm is connected to the drive section. The forearm is movably connected to the upper arm. The pair of end effectors is movably connected to the forearm. The forearm has a support member fixed thereto. The pair of end effectors is movably mounted to support member to allow each end effector of the pair of end effectors to rotate independently relative to the forearm. The drive section is operably connected to each end effector so that each end effector is moved independently by the drive section.

BRIEF DESCRIPTION OF THE DRAWINGS

The foregoing aspects and other features of the present invention are explained in the following description, taken in connection with the accompanying drawings, wherein:

FIG. 4A is another schematic elevation view of the articulated arm showing the arm in another position;

FIG. 6 is a cross-sectional view of an end effector drive of the articulated arm taken through line 6—6 in FIG. 2.

DETAILED DESCRIPTION OF THE PREFERRED EMBODIMENT

Figure 1:
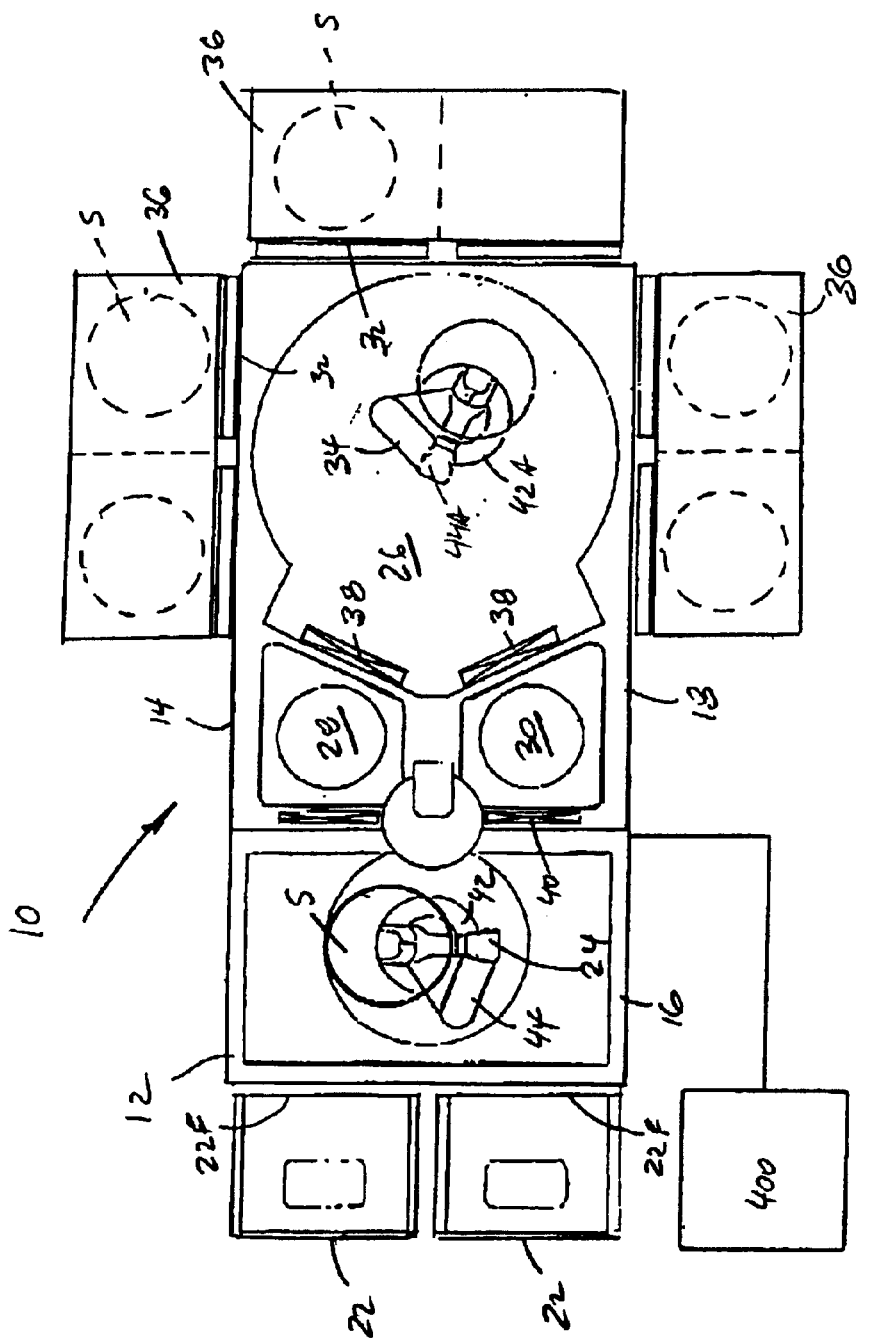
FIG. 1 is a schematic top plan view of a substrate processing apparatus incorporating features of the present invention.

Referring to FIG. 1, there is shown an exploded perspective view of a substrate processing apparatus 10 incorporating features of the present invention. Although the present invention will be described with reference to the single embodiment shown in the drawings, it should be understood that the present invention can be embodied in many alternate forms of embodiments. In addition, any suitable size, shape or type of elements or materials could be used.

The substrate processing apparatus 10 may comprise a front or atmospheric section 12, and an adjoining back or vacuum section 14. The arrangement of the processing apparatus 10 shown in FIG. 1 is exemplary, and in alternate embodiments, the substrate processing apparatus may have any suitable arrangement or configuration. In the embodiment shown in FIG. 1, the front section 12 generally has a frame 16, substrate holding cassettes 22, and a substrate transport apparatus 24. The back section 14 generally has a main section 18, processing modules 36, and a vacuum substrate transport apparatus 34. The frame 16 of the front section 12 may be adjacent of the back section 14 of the substrate processing apparatus 10. The front section frame 16 generally supports a number (only two are shown in FIG. 1 for example purposes) of the substrate holding cassettes 22 which hold a number of substrates S therein. The substrates may be for example, semiconductor wafers, flat panel displays substrates, or any other suitable type of substrates. The frame 16 of the front section 12 is open to atmosphere. The atmospheric substrate transport apparatus 24 is mounted to the frame 16 for transporting substrates between the holding cassettes 22 and the vacuum back section 14 of the apparatus 10. The main section 18 of the back section 14 includes a central chamber 26, and intermediate chambers 28, 30. Processing modules 36 are disposed generally around the main section 18 and communicate with the central chamber 26 through openings in the exterior of the main section. The intermediate chambers 28 communicate with the central chamber 26 through internal openings in the main section. The main section 18 also has outer openings allowing the intermediate chambers 28, 30 to communicate with the adjoining atmospheric front section 12. The vacuum substrate transport apparatus 34 is mounted in the main section for transporting substrates through the central chamber 26 between the intermediate chambers 28 and the processing modules 36. The processing modules 36 include one or more chambers with appropriate systems to perform processes such as for example, sputtering, coating, etching, soaking, or any other suitable process on substrates deposited in the chambers. The central chamber 26 of the back section 14 is maintained substantially in a vacuum to prevent contamination of substrates when being transported between the intermediate chambers 28, 30 and processing modules 36. Outer openings 32 of the back section may be closed to isolate the central chamber 26 from the processing modules 36. Internal openings 38 may be closed to isolate the central chamber 26 from intermediate chambers 28, 30 and outer openings 40 of main section 18 may be closed to isolate the intermediate chambers from atmospheric conditions outside the chambers. The substrate processing apparatus 10 further includes a controller 400 which controls the operation of the apparatus 10. In accordance with commands from the controller 400, the atmospheric transport apparatus 24 transports new substrates from cassettes 22 to intermediate chambers 28, 30 and returns processed substrates from the intermediate chambers to the cassettes 22. The atmospheric transport apparatus 24 may have multiple independent end effectors to rapidly swap substrates in and out of cassettes 22 as will be described in greater detail below. One or both of the intermediate chambers 28, 30 may be configured as a load lock. The controller 400 cycles the load lock and operates the vacuum substrate transport apparatus 34 to transport substrates from intermediate chambers 28, 30 through the central chamber to processing modules 36. The vacuum transport apparatus 34 may have multiple independent end effectors to rapidly swap substrates in and out of the load locks or processing modules as will be described in greater detail below. The substrates are then processed and returned through the intermediate chambers to cassettes 22.

Still referring to FIG. 1, in the embodiment shown, the frame 16 of the front section 12 supports two cassettes 22 from the front end 20 of the frame. The cassettes 22 are held in a generally side by side configuration. The cassettes may be front opening uniform pods (FOUP) which in the preferred embodiment are capable of holding about 26, 200/300 mm semiconductor substrates. In alternate embodiments, the front section frame may support any desired number of substrate holding cassettes. The cassettes may be of any suitable type and be capable of holding any desired number of substrates. The cassettes may be capable of holding any desired type of substrates including substrates used in manufacturing flat panel displays. In other alternate embodiments, the substrate holding cassettes may be also located on the sides of the front section frame as well as the front. Each cassette 22 has a front face 22F facing the frame 16 of the front section 12. The front face 22F has an opening (not shown) through which substrates S are removed and inserted into the respective cassette 22. As seen in FIG. 1, the atmospheric substrate transport apparatus 24 is mounted to frame 16 between the cassettes 22 and the back section 14 of the apparatus 10. In the preferred embodiment, the substrate transport apparatus 24 comprises a drive section 42 which moves a movable arm 44.

Still referring to FIG. 1, the vacuum section 14 is shown in an exemplary configuration, and in alternate embodiments the vacuum section may have any suitable arrangement. In the embodiment shown in FIG. 1, the main section 18 has a general rectangular shape. The processing modules 36 are shown located along three sides of the main section 18, though in alternate embodiments processing modules may be located on one or two sides. Also, in this embodiment two processing modules 36 may be located on each side of the main section 18. As seen in FIG. 1, the processing modules 36 on each side of the main section are offset radially from the vacuum substrate transport apparatus 34. The intermediate chambers 28, 30, located as noted before on a side of the main section 18 adjacent the atmospheric module 12, may be oriented to be radially aligned with the substrate transport apparatus 34. The substrate transport apparatus 34 may be substantially centered in the central chamber 26 of the main section 18. The vacuum substrate transport apparatus 34 may be substantially similar to the atmospheric transport apparatus 24 with a drive section 42A and an articulated arm assembly 44A. As noted before, the vacuum transport apparatus 34 has multiple independent end effectors on the arm assembly.

Figure 2:
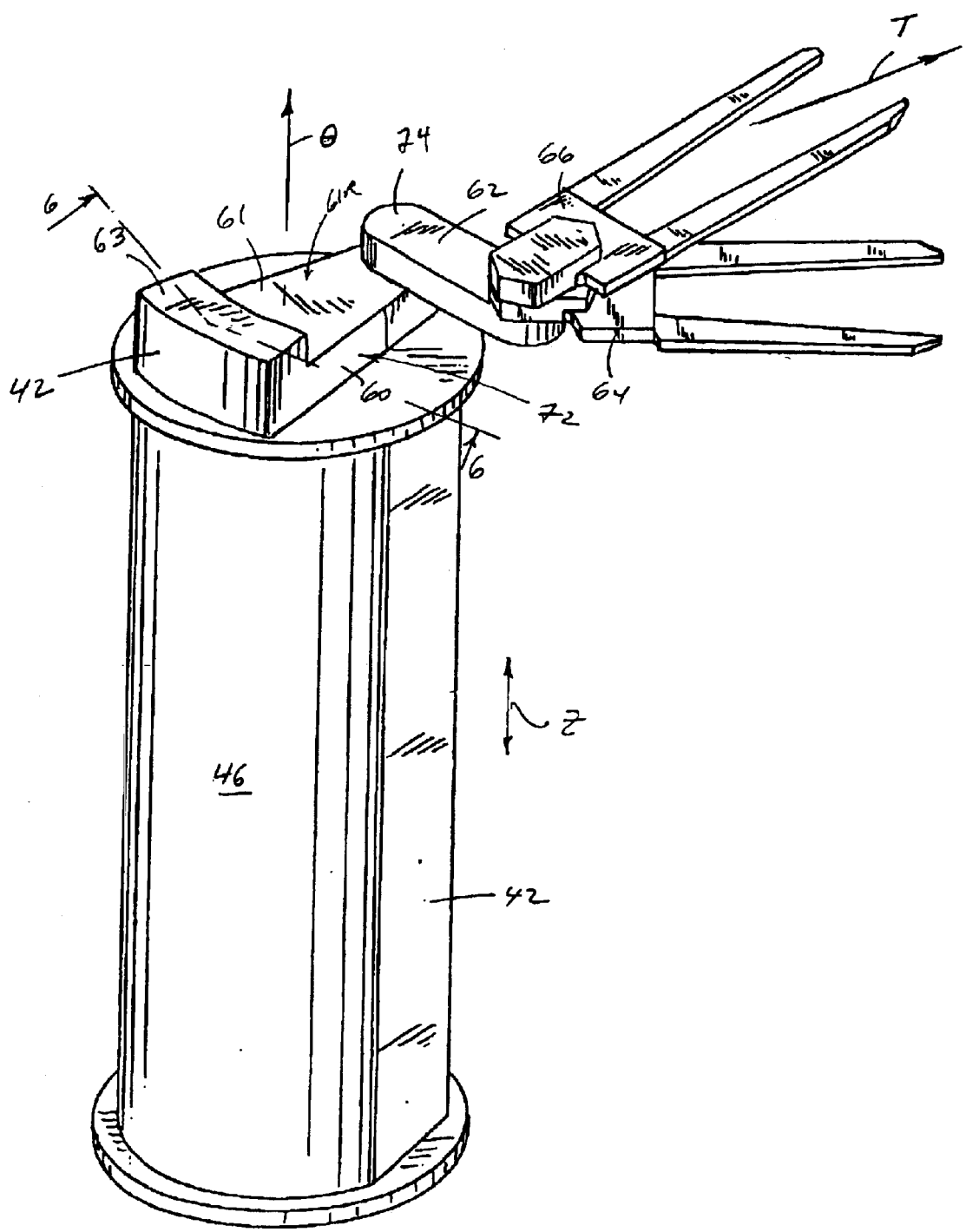
FIG. 2 is a perspective view of a substrate transport apparatus of the substrate processing apparatus in FIG. 1.
Figure 3:
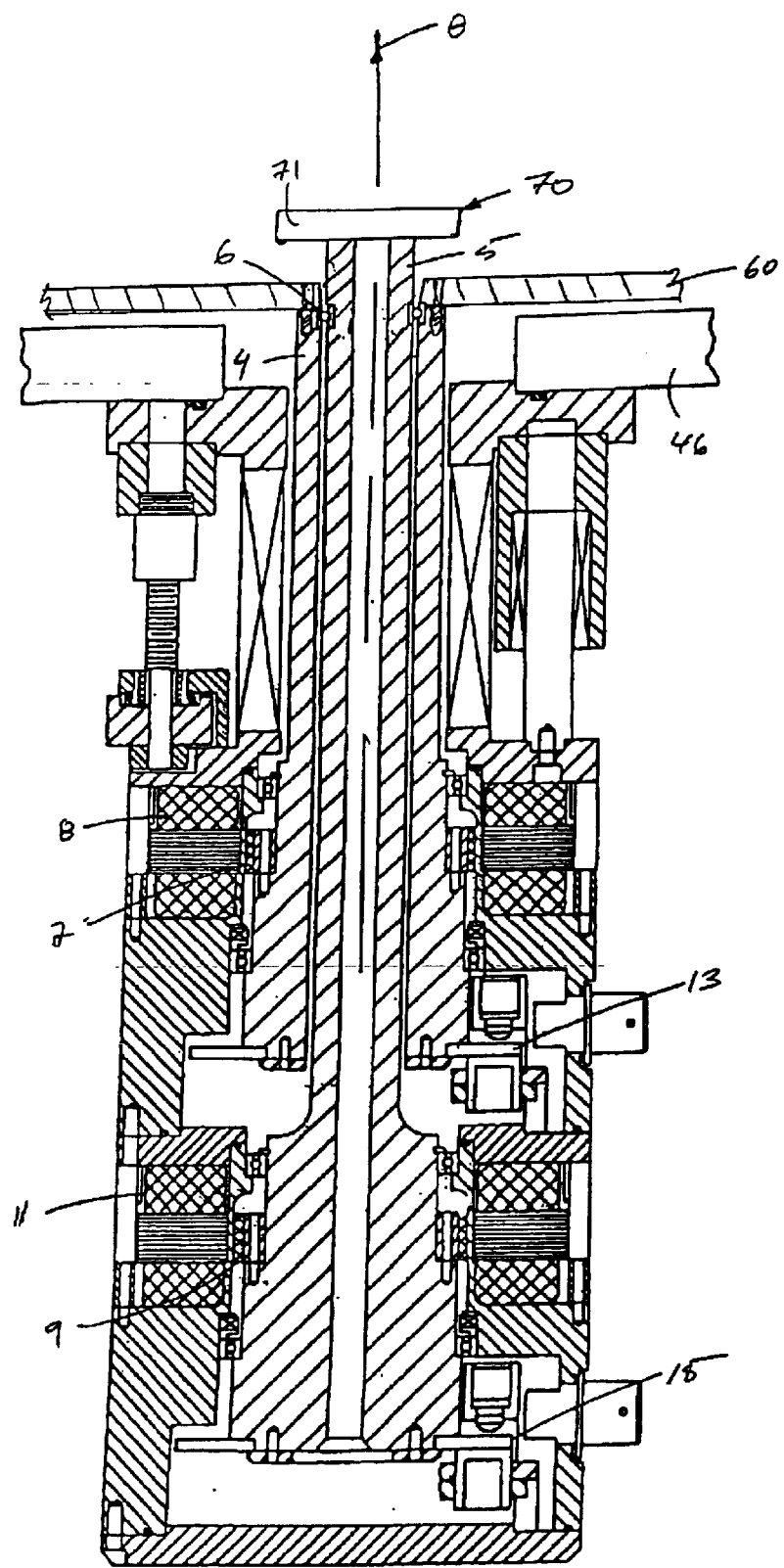
FIG. 3 is a cross-sectional view of a drive section of the substrate transport apparatus in FIG. 2.

The atmospheric transport apparatus 24 and vacuum transport apparatus 34 in this embodiment are substantially similar. Hence, the atmospheric apparatus 24 and vacuum apparatus will be described in greater detail below with specific reference to the atmospheric apparatus 24. As seen in FIG. 2, the movable arm 44 has four sections including upper arm 60, forearm 62, and two end effectors 64, 66. The upper arm 60 and forearm 62 are connected in series. The forearm 66 supports the two end effectors 64, 66 that are stacked one over the other at one end of the forearm. The upper arm is connected to the drive section 42 as will be described in greater detail below. In this embodiment, the drive section 42 of the transport apparatus 24 may be fixedly mounted to the frame 16 with the center of the transport apparatus being between the side by side cassettes 22 (see FIG. 1). In alternate embodiments the drive section may be mounted on a car capable of movement in the horizontal plane relative to the frame of the apparatus. The drive section 42 is a three-axis drive section capable of moving the movable arm 44 along three axes. The drive section 42 includes suitable drives (not shown) for vertically raising and lowering (i.e. movement along the "Z" axis) the movable arm 44. For example, the drive section may include a housing 46 (see also FIG. 2) from which the movable arm 44 is supported. The vertical drives may include a motor and ball screw arrangement (not shown) connected to the housing which when operated raise and lower the housing (in the direction indicated by arrow Z in FIG. 2) along the ball screw. In alternate embodiments, the vertical drive may be any suitable type of linear drive. The vacuum transport apparatus (see FIG. 1) may not have a vertical drive. Referring now also to FIGS. 2 and 3, the housing preferably includes a co-axial drive 48 for moving the movable arm 44 about the rotation axis θ (i.e. θ movement) and for extending or retracting the arm along the radial axis T (i.e. T movement). In the embodiment shown the co-axial drive 48 of drive section 42 is a co-axial drive such as shown in U.S. Pat. No. 5,899,658, which is incorporated by reference herein in its entirety. In alternate embodiments, the co-axial drive may be any other suitable drive capable of moving the movable arm to generate both θ movement and T movement.

As seen in FIG. 3, the housing 46 has a flange with a central aperture through which two concentric output shafts extend. The outer shaft is designated 4, and the inner shaft is designated 5. At the extremities of the output shafts a pilot bearing 6 separates the shafts and supports them upon each other. The two shafts are independently rotatable about rotation axis θ. The motion of the shafts may be one in which they rotate together, and another in which they rotate in opposite directions. The former motion serves to rotate the arm 44, and the latter motion serves to extend and retract the arm. The inner shaft is longer than the outer shaft, and the extremity of the inner shaft outside the housing 46 extends beyond the corresponding extremity of the outer shaft. The extremity of the inner shaft 5 is connected to a drive pulley 71 of transmission system 70. The extremity of the outer shaft is directly fastened to the upper arm 60. Accordingly when the outer shaft 4 is rotated, the upper arm rotates with the shaft about axis θ. A rotor 7 is supported on the outer surface of the outer shaft 4, and a corresponding stator 8 is supported outside the rotor 7. Similarly, a rotor 9 is supported on the outer surface of the inner shaft 5, and a corresponding stator 11 is supported outside the rotor 9. Each stator is part of a drive which rotates the corresponding shaft. Each rotor-stator pair 7, 8 and 9, 10 may form part of a conventional brushless DC motor such as the M & K Series manufactured by Technology Inc., 200 Thirteenth Avenue, Ronkonkoma, N.Y. 11779. In alternate embodiments, the drive section may include any other suitable type of motors, such as for example brushless AC motors, stepper motors, conventional (brushed) AC or DC motors, to effect rotation of the inner and outer shafts. Each shaft 4, 5 may have a corresponding encoder mechanism 13, 15 suitable for measuring the rotation of the shaft. The encoders 13, 15 are connected to controller 400 (See FIG. 1) and signal the shaft rotation and position to the controller.

Figure 4:
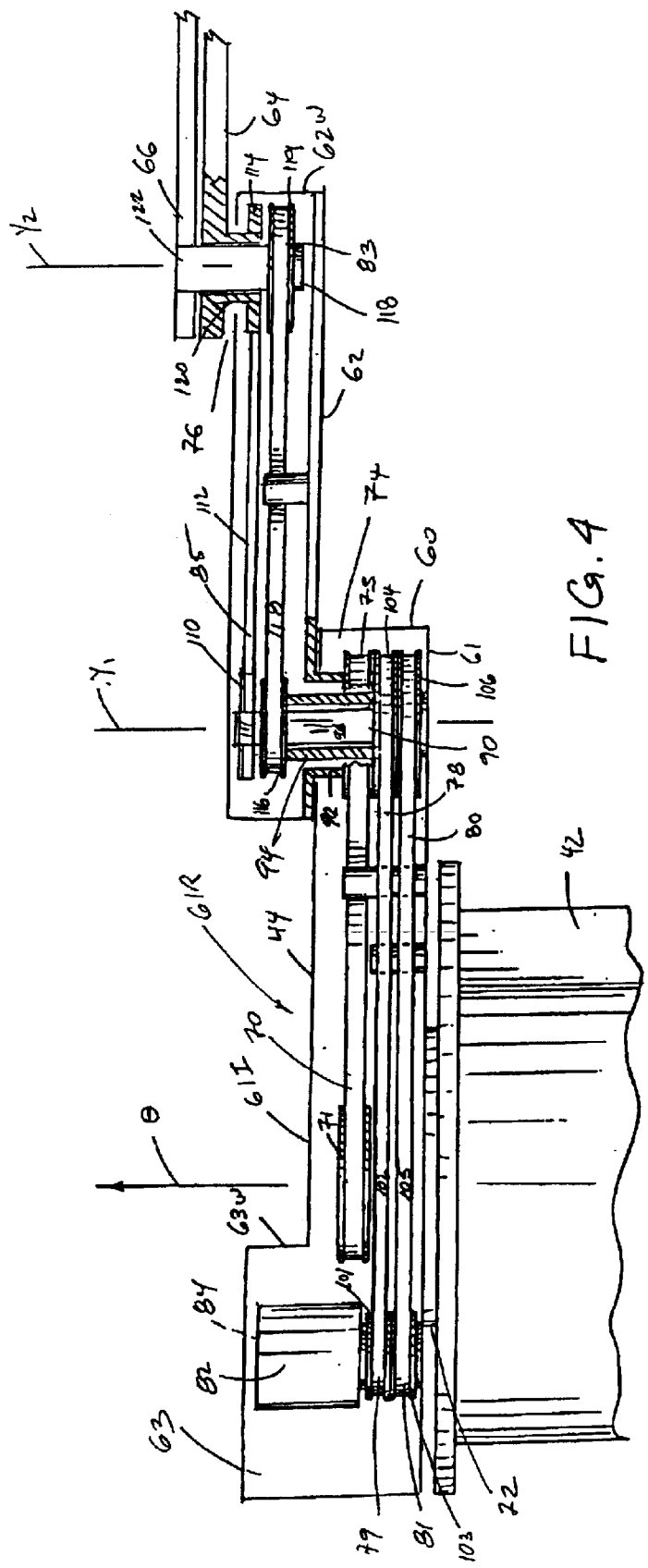
FIG. 4 is a schematic elevation view of the articulated arm in FIG. 4.
Figure 5:
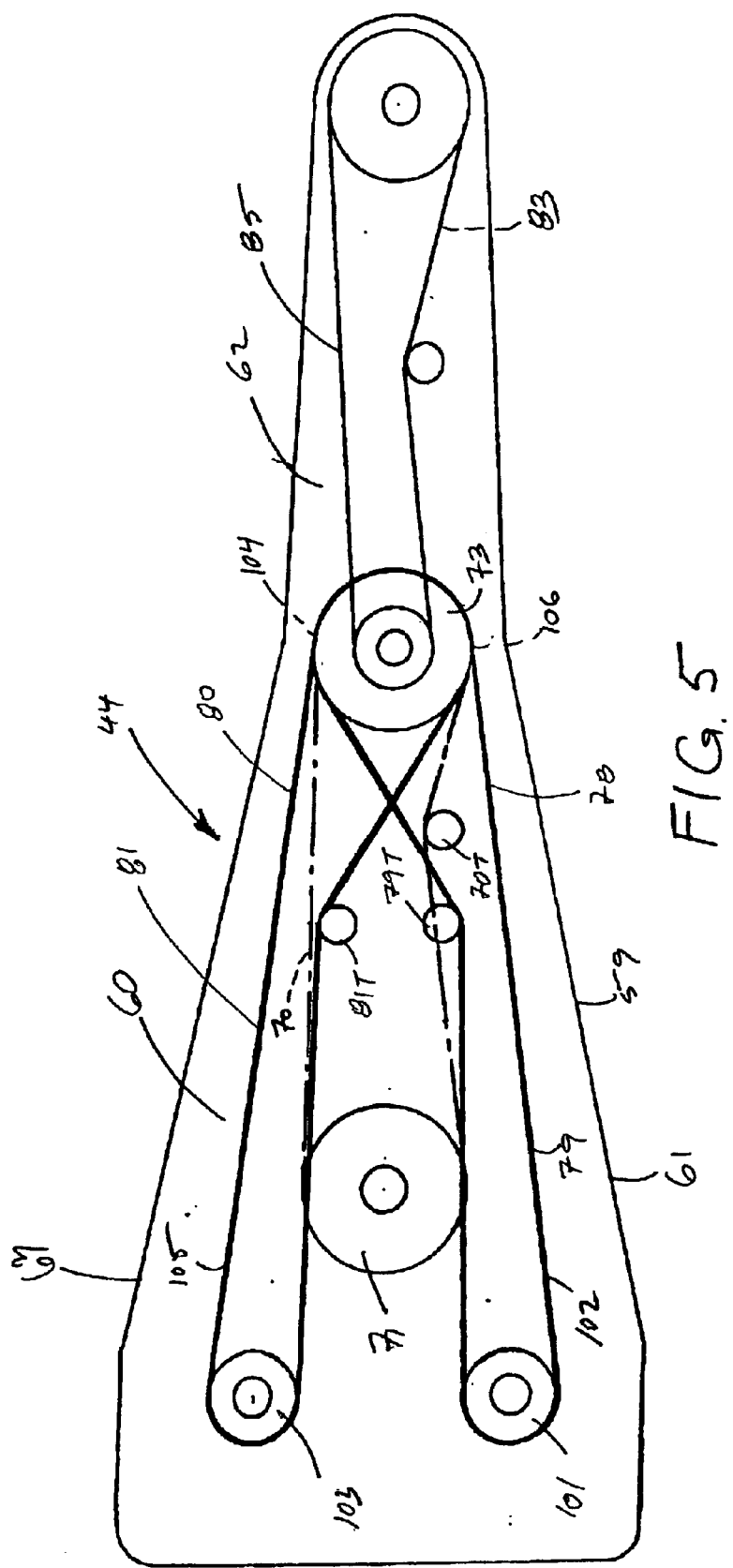
FIG. 5 is a schematic bottom view of the articulated arm of the substrate transport apparatus in FIG. 2.

Referring now to FIGS. 4 and 5, there is shown respectively a schematic cross sectional elevation and a schematic top plan view of arm assembly 44 (the end effectors 64, 66 are not shown in FIG. 5 for clarity) As noted before, arm assembly 44 includes upper arm 60, forearm 62, and in this embodiment, two end effectors 64, 66, though in alternate embodiments the arm may have any desired number of end effectors. For example, the arm may have but one end effector mounted on the forearm. The arm assembly 44 also includes transmission system 70 for rotating the forearm 62 and two end effector drive systems 78, 80 for independently rotating the end effectors 64, 66. The upper arm 60 has an outer casing 61, or other suitable structural frame which is shown schematically in FIGS. 4 and 5. As noted before, the outer casing 61 of the upper arm 60 (which may be made from any suitable material) is fastened directly to the outer shaft 4 of the co-axial drive. The joint between the upper arm casing 61 and outer drive shaft 4 defines the shoulder 72 of the arm assembly 44. The outer casing 61 also pivotally supports the forearm 62 as shown in FIG. 4 thereby defining the elbow joint 74 of the arm assembly. As can be realized from FIGS. 2 and 4, rotation of the outer shaft 4, rotates the upper arm casing 61, and hence the entire arm, about axis θ which extends through the shoulder 72. As shown in FIGS. 4 and 5, the outer casing 61 of the upper arm holds transmission system 70, and part of end effector drive systems 78, 80. Transmission system 70 generally comprises a drive pulley 71, idler pulley 73 and belt 70. As noted before, drive pulley 71 is mounted on the inner shaft 5 of the co-axial drive unit at the shoulder 72 of the arm. The idler pulley 73 is mounted on outer shaft 92 of the co-axial shaft assembly 90 at the elbow 74 of the arm assembly 44. The belt 70 connects the drive pulley 71 to the idler pulley 73 so that rotation of the drive pulley 71 (caused by rotation of the inner shaft 5) imparts rotation of the 73 and hence of shaft 92.

The coaxial shaft assembly 90 at the elbow 24 preferably comprises three concentric shafts 92, 94, 96. The outer shaft 92, intermediate shaft 94 and inner shaft 96 are rotatably supported from the outer casing 61 by a suitable combination of thrust and roller or ball bearings (not shown) so that the shafts may rotate independently about axis $y_1$ at the elbow 74 of the arm. The outer shaft 92 is shortest, with the intermediate shaft 94 and inner shaft 96 extending serially both above and below the outer shaft (as seen in FIG. 4). The outer shaft 92 is fastened at one end to the forearm 62, and the idler pulley 73 is fixedly mounted onto the outer shaft 92. Accordingly, when the transmission system 70 rotates the idler pulley 73, the forearm 62 is rotated about axis $Y_1$ at the wrist.

The part of the end effector drive systems housed in the outer casing 61 of the upper arm include motors 82, 84 and transmission segments 79, 81. The outer casing 61 has an extended portion 63 which depends from inner portion 61I of the casing (see FIG. 4). Inner portion 61I extends between the shoulder 72 and the elbow 74. As shown in FIG. 4 the extended portion 63 is located on the opposite side of the shoulders (i.e. axis of rotation θ) from the inner portion 61I of the outer casing. The extended portion 63 may be enlarged relative to the rest of the outer casing 61. The extended portion has an inner wall 63W located sufficiently back from the shoulder to allow the forearm to rotate freely 360° about axis $Y_1$ at the elbow without interference with the extended portion 63 of the upper arm 60. As seen in FIG. 4A, the extended portion 63 and inner portion 61I define a step or recess 61R in the upper arm in which the forearm 62 is located. Accordingly, this arrangement having the forearm 62 located in a recess 63R of the upper arm 60 allows the overall stack height (i.e. between uppermost surface 66T and lowermost surface 66B) of the arm assembly (indicated at H in FIG. 4A) to be smaller in comparison to conventional arm assemblies. Also, in having the extended portion 63 of the upper arm 60 offset from the shoulder, the height of the extended portion 63 may be sized as desired to house motors 82, 84 for the end effector drive system without increasing the stack height of the arm assembly or interfering with forearm motion. In this embodiment, the extended portion 63 houses two motors 82, 84 of the end effector drive system. In this embodiment, the motors 82, 84 are housed side by side as will be described in greater detail below (see FIG. 6). Accordingly, as seen in FIG. 2, the outer casing 61 has a generally tapered shape that is narrow at the elbow 74 and widens towards the extended portion 63. In alternate embodiments however, the outer casing of the upper arm may have any suitable shape to accommodate the motors and transmissions of the end effector drive system as well as the transmission system moving the forearm.

Referring now also to FIG. 6, there is shown a schematic cross-section taken through line 6—6 in FIG. 2 of the extended portion 63 of the upper arm outer casing 61. As seen in FIG. 6, in this embodiment the two motors 82, 84 are mounted in a side by side arrangement. In alternate embodiments, as has been noted before, the arm assembly may have any suitable number or motors for independently rotating the end effectors, and the motors may be arranged in any desired configuration in the upper arm. For example, in an alternate embodiment in which the arm assembly has one end effector, only one motor for moving the end effector would be located in the extended portion of the upper arm. In other alternate embodiments, the motors in the upper arm may be arranged in any other suitable manner, such as for example, an asymmetric arrangement, or an inline arrangement aligned with the rotation axis at the shoulder of the arm. Motors 82, 84 may be brushless DC motors such as available from Kollmorgan though any other suitable motors may be used. This is particularly advantageous in the vacuum transport apparatus 34 (see FIG. 1), because brushless motors minimize contact between moving parts thereby avoiding generation of contamination in the vacuum section of the apparatus. The motors 82, 84 are substantially similar, except as otherwise noted and will be described below with reference to motor 82. Motor 82 may have a housing 82H which holds shaft 82S. The housing 82H may be supported from the top 63T of the extended portion 63. The shaft 82S is rotatably held in the housing by suitable radial and axial bearings. The shaft 82S has a rotor 82R of the DC motor mounted thereon. The stator 82T is mounted on the housing 82H. The shaft 82R is also provided with a suitable encoder (not shown), which is connected to the controller 400 (see FIG. 1) to signal the rotation/position of shaft 82S to the controller. When motor 82 is energized, the motor drives end effector drive system 78 which rotates the end effector 64 (See FIG. 4). Accordingly, one end of shaft 82S is connected to drive pulley 101 of transmission segment 79. Motor 84 is used to power drive system 80 which rotates end effector 66. Shaft 84S is connected to drive pulley 103 of transmission segment 81. The end of shaft 84S is located such that pulley 103 is located below pulley 101 on shaft 82S. The end of shaft 82S is located such that pulley 101 is below pulley 71 (see FIG. 4). Transmission segment 79 (located in the upper arm 60) of drive system 78 includes drive pulley 101 as well as idler 104 and belt 102. The idler 104 and drive pulley 101 may be sized to provide for example a 4:1 pulley reduction, though any other desired pulley reduction may be used. In alternate embodiments, the transmission segment in the upper arm may have any other desired drive to idler pulley ratio. Idler 104 is mounted on intermediate shaft 94 of co-axial shaft assembly 90 at the elbow 74 (see FIG. 4). Belt 102 connects the drive pulley 101 and idler 104. Transmission segment 81 (in the upper arm 60) of the second end effector drive system 80 includes drive pulley 103 as well as idler 106 and belt 105. Idler 106 is mounted on inner shaft 96 of co-axial shaft assembly 90 at the elbow 74. Belt 105 connects the drive pulley 103 and idler 106. As shown in FIG. 4, transmission segments 79, 81 are located one over the other in the upper arm, with segment 81 below segment 79. Both transmission segments 79, 81 are below transmission system 70 for operating the forearm. FIG. 5 shows a schematic bottom view illustrating the arrangement of transmission system 70, and end effector drive systems 78, 80 inside the arm assembly 44. As seen in FIG. 5, tension members 70T, 79T, 80T, such as spring loaded bearings, may be provided in the arm assembly to prevent slack on the belts 70, 102, 105, and to restrain the belts away from pulleys of adjoining drive systems.

As seen in FIGS. 4, 5, and 6, the end effector drive systems 78, 80 each include a second transmission segment 83, 85 which are housed in the forearm 62. Transmission segment 85 transmits torque from inner shaft 96 (which is powered by segment 81) to rotate end effector 66. Transmission segment 83 transmits torque from intermediate shaft 94 (powered by segment 79) to rotate end effector 64. Transmission segment 85 includes pulley 110, idler 114 and belt 112. Pulley 110 is mounted on the upper end of inner shaft 96 so that the pulley and shaft rotate together about axis $Y_1$ at elbow 74. Idler 114 is fixedly mounted to shaft 120 of co-axial shaft assembly 118 located at the wrist end 62W of the forearm. Co-axial shaft assembly 118 includes preferably outer shaft 120 and inner shaft 122. The outer and inner shafts 120, 122 are supported by suitable radial and thrust bearings allowing the shafts to rotate independently about axis of rotation $Y_2$ at the wrist 76. The outer shaft 120 is fixedly connected to end effector 64. Thus, when torque is transferred by belt 112 to idler 114, the outer shaft 120 rotates end effector 64 about axis $Y_2$. Transmission segment 83 includes pulley 116, idler 119, and belt 118. Pulley 116 is mounted on the upper end of intermediate shaft 94. The idler 119 is mounted fixedly onto inner shaft 122 so that the idler and shaft rotate as a unit about axis $Y_2$. The inner shaft 122 is also fixedly mounted at the other end to end effector 66. Accordingly, when torque is transferred by belt 118 from pulley 116 (on shaft 94) to idler 119, the inner shaft 122 rotates end effector 66 about axis $Y_2$ at the wrist. In this manner, the end effectors may be rotated independently about axis $Y_2$ at the wrist. This may be used in an advantageous manner when transporting substrates, by rapidly swapping substrates into and out of a given chamber. By way of example, one end effector 64 may be extended into a chamber to pick up a substrate therein, while the other end effector 66 (which holds a replacement) is turned slightly away, for example no more than about 90°, to prevent interference with the chamber. The arm 44 is then moved to withdraw the substrate from the chamber and to orient the other end effector 66 with that chamber. The first end effector 64 is then turned away and the arm is moved to place the second end effector 66 in the chamber. As can be realized, the end effector drive systems 78, 80 allow each end effector 64, 66 to be continuously and independently rotated about axis Y2 at the wrist relative to the other end effector 64, 66 and relative to the arm itself.

This invention allows for fast wafer/substrate swaps using a transport apparatus 24, 34 with a two-link arm 44 with two independent articulated end effectors 64, 66. The present invention couples an arm 44 with two motors 82, 84 mounted in the upper arm to a three-axis robot. The two motors 82, 84 in the upper arm 60 are offset beyond the robot center (as identified by axis of rotation θ in FIG. 2) but inside the arm swept diameter. The tapered or wedge shape of the upper arm 60 allows for the motor assemblies that drive the articulated end effector/wrist modules to share the height of the upper arm and forearm. This reduces the overall height of the arm. In contrast, conventional three-axis transport apparatus have the motors powering motion of the upper arm, forearm, and end effectors located along a co-axial shaft assembly at the shoulder. The motors are vertically stacked along the shaft assembly so that each motor may be connected to a corresponding shaft. The stacking of the motors in the conventional apparatus causes the overall height of the drive section at the arm shoulder to increase with a resultant increase in the space envelope used for the transport apparatus. Moreover, the articulated arm assembly which is mounted to the top of drive section at the shoulder is elevated higher with respect to a base of the processing apparatus. This may prevent the uppermost end effector from reaching the substrates held in the lowermost storage positions of the storage areas or processing modules. It is desired to minimize this height in order to reach the lowest substrate with the top end effector 66. The instant embodiment achieves this by placing the drive motors moving the end effectors in the upper arm and in effect having the drive motors shape the height of the upper arm and forearm. The motors are coupled to a tri-axial elbow assembly 90 via timing belts and a pulley reduction. The pulley reduction may be 4:1, as previously described, though any other pulley reduction may be used. From the elbow to the wrist the motors are again coupled with timing belts to a co-axial wrist joint to which the end effectors are mounted. The center of gravity of the upper arm is also moved closer to the center of the robot. One motor can be removed from the upper arm, and the arm can be utilized as a 4-axis design. In this case the arm has but one end effector mounted on the forearm. Existing solutions typically have motors located at the wrist joint. The proposed design has the motors in the upperarm which drastically reduces the forearm inertia and will improve the robot arm controllability. Moreover as noted before, the end effector, or end effectors are each capable of continuous and independent rotation about the wrist with respect to the forearm and with respect to each other (in the case the arm has two or more end effectors as shown in FIG. 1). This allows the use of simpler controller architecture for controlling the movement of the arm between substrate storage/processing stations. A further advantage of this degree of freedom provided the end effector(s) is that the arm may employ shorter moves when moving between storage/processing stations and teaching the arm the desired motion is simplified.

It should be understood that the foregoing description is only illustrative of the invention. Various alternatives and modifications can be devised by those skilled in the art without departing from the invention. Accordingly, the present invention is intended to embrace all such alternatives, modifications and variances which fall within the scope of the appended claims.

What is claimed is:

1. A substrate processing apparatus comprising:
   a frame;
   a drive section connected to the frame;
   an articulated arm connected to the drive section, the articulated arm having a shoulder and a wrist, the articulated arm being pivotally mounted to the drive section at the shoulder, the drive section being adapted to rotate the articulated arm relative to the frame about an axis of rotation at the shoulder, and to displace the wrist relative to the shoulder; and
   at least one pair of end effectors connected to the articulated arm, the at least one pair of end effectors being pivotally jointed to the wrist of the articulated arm to rotate relative to the articulated arm about a common axis of rotation at the wrist, wherein each of the at least one pair of end effectors is independently pivotable relative to each other about the common axis of rotation at the wrist and at least one of the at least one pair of end effectors is independently pivotable about the common axis of rotation at the wrist relative to the articulated arm.

2. The apparatus as in claim 1, wherein the articulated arm has an upper arm and a forearm connected to the upper arm, the at least one pair of end effectors being movably mounted to the forearm.

3. The apparatus as in claim 1, wherein the drive section has a drive motor for independently driving each end effector of the at least one pair of end effectors.

4. The apparatus as in claim 3, wherein each end effector is drivingly connected to the drive motor independently driving the end effector by a corresponding transmission.

5. The apparatus as in claim 1, wherein the drive section has a co-axial shaft assembly in a drive section casing located at the shoulder of the articulated arm, and wherein the drive section has another section with at least one motor for moving the at least one of the at least one pair of end effectors, the at least one motor being located in an upper arm of the articulated arm.

6. The apparatus as in claim 5, wherein the at least one motor is located on the upper arm proximate to the co-axial shaft assembly.

7. The apparatus as in claim 5, wherein the upper arm has structure that substantially encases the at least one motor.

8. The apparatus as in claim 5, wherein the upper arm supports a forearm at an elbow end of the upper arm, and wherein the upper arm has an extension section extending from the shoulder in a direction opposite from the elbow end, the at least one motor being mounted to extension section of the upper arm.

9. The apparatus as in claim 5, wherein the upper arm has another motor mounted thereon for independently rotating another end effector of the at least one pair of end effectors about the common axis of rotation.

10. The apparatus as in claim 9, wherein the at least one motor and the other motor are located adjacent one another in the extension section of the upper arm, drive shafts of the at least one motor and the other motor being offset and substantially parallel to each other.

11. The apparatus as in claim 9, wherein the at least one motor and the other motor are mounted to the upper arm substantially equidistant from the shoulder.

12. A substrate transport apparatus comprising:
    a drive section;
    an upper arm connected to the drive section;
    a forearm movably connected to the upper arm; and at least one pair of end effectors movably connected to the forearm so that the at least one pair of end effectors is movable relative to the forearm, the at least one pair of end effectors being located on the forearm, and being operably connected to the drive section for moving the at least one pair of end effectors relative to the forearm, wherein each end effector of the at least one pair of end effectors is independently movable relative to each other.

13. The apparatus as in claim 12, wherein at least one end effector of the at least one pair of end effectors is moved independently by the drive section relative to the forearm.

14. The apparatus as in claim 12, wherein the at least one pair of end effectors rotate relative to the forearm about a common axis of rotation.

15. The apparatus as in claim 12, wherein drive section has a pair of end effector drive motors, each end effector drive motor independently driving a corresponding end effector from the at least one pair of end effectors.

16. The apparatus as in claim 15, wherein the pair of drive motors are located on the upper arm proximate a shoulder axis of rotation of the upper arm.

17. The apparatus as in claim 15, wherein the pair of end effector drive motors are located side by side in the upper arm.

18. The apparatus as in claim 15, wherein at least one of the pair of end effector drive motors is located on the upper arm offset from a shoulder of the upper arm, the at least one motor being offset on an opposite side of the shoulder from and elbow joint formed between the upper arm and the forearm.

19. The apparatus in claim 12, wherein the upper arm has an extended section sized to accommodate a pair of end effector drive motors.

20. The apparatus as in claim 19, wherein each end effector drive motor of the pair of motors has a shaft with a pulley wheel drivingly connected to a corresponding end effector of the at least one pair of end effectors, and wherein the pulley wheel on each shaft is located between an uppermost pulley wheel on the co-axial shaft assembly and a lower surface of the upper arm.

21. The apparatus as in claim 12, wherein the upper arm has a first section extending between a shoulder of the upper arm and an elbow joint between the upper arm and forearm, and a second section extending from the first section on an opposite side of the shoulder from the first section and wherein the drive section has a pair of motors inside the second section for driving the end effectors.

22. The apparatus as in claim 21, wherein the second section and the first section define a recess in which the forearm is located.

23. The apparatus as in claim 12, wherein the upper has a general wedge shape accommodating converging transmissions linking the end effectors to drive motors of the drive section located in the upper arm.

24. A substrate transport apparatus comprising:

a drive section having a co-axial shaft assembly;

an articulated arm operably connected to the co-axial shaft assembly at a shoulder of the arm for rotating the arm about the shoulder and extending or retracting the arm relative to the shoulder;

at least one pair of end effectors movably connected to the articulated arm so that each end effector of the at least one pair of end effectors is independently pivotable relative to the articulated arm about a common axis of rotation; and another drive section operably connected to the at least one pair of end effectors for moving the end effectors relative to the arm, the other drive section having at least one motor mounted on the arm proximate the shoulder.

25. The apparatus as in claim 24, wherein the at least one motor is mounted on the arm on an opposite side of the shoulder from an elbow joint of the articulated arm.

26. The apparatus as in claim 24, wherein the other drive section has a pair of motors mounted on the arm for moving the at least one pair of end effectors.

27. The apparatus as in claim 26, wherein each motor of the pair of motors has a shaft with a pulley wheel drivingly connected to a corresponding end effector of the at least one pair of end effectors, and wherein the pulley wheel on each shaft is located between an uppermost pulley wheel on the co-axial shaft assembly and a lower surface of the arm.

28. A substrate transport apparatus comprising:

a drive section;

an upper arm connected to the drive section;

a forearm movably connected to the upper arm; and at least one pair of end effectors movably connected to the forearm;

wherein the forearm has a support member fixed thereto, the at least one pair of end effectors being movably mounted to the support member to allow each end effector of the at least one pair of end effectors to rotate independently of each other relative to the forearm, the drive section being operably connected to each end effector so that each end effector is moved independently of each other by the drive section.

29. The apparatus as in claim 28, wherein the drive section has a drive motor for independently rotating one end effector of the at least one pair of end effectors, the drive motor being located in the upper arm and connected to the one end effector by a transmission at least part of which extends through the upper arm from one end of the upper arm located proximate a shoulder of the upper arm to an elbow end of the upper arm.

30. A substrate transport apparatus comprising:

a drive section having a co-axial shaft assembly;

an articulated arm operably connected to the co-axial shaft assembly at a shoulder of the arm for rotating the arm about the shoulder and extending or retracting the arm relative to the shoulder;

at least one end effector movably connected to the articulated arm so that the at least one end effector is independently pivotable relative to the articulated arm about an axis of rotation; and another drive section operably connected to the at least one end effector for moving the end effector relative to the arm, the other drive section having at least one motor mounted on the arm proximate the shoulder.

* * * * *